(12) United States Patent
Ogawa

(10) Patent No.: US 9,773,632 B2
(45) Date of Patent: Sep. 26, 2017

(54) FUSE ELEMENT ASSEMBLIES

(71) Applicant: Micron Technology, Inc., Boise, ID (US)

(72) Inventor: Sumio Ogawa, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 56 days.

(21) Appl. No.: 14/847,235

(22) Filed: Sep. 8, 2015

(65) Prior Publication Data

US 2017/0069454 A1 Mar. 9, 2017

(51) Int. Cl.
*H01H 85/05* (2006.01)
*H01H 85/143* (2006.01)

(52) U.S. Cl.
CPC .......... *H01H 85/05* (2013.01); *H01H 85/143* (2013.01)

(58) Field of Classification Search
CPC ............................ H01H 85/05; H01H 85/143
USPC ................. 257/529, E23.149; 365/96, 225.7
See application file for complete search history.

(56) References Cited

U.S. PATENT DOCUMENTS

| | | | | |
|---|---|---|---|---|
| 5,257,225 A | * | 10/1993 | Lee | G11C 16/12 365/185.17 |
| 6,433,287 B1 | * | 8/2002 | Sasaki | H01L 23/5226 174/261 |
| 6,452,248 B1 | * | 9/2002 | Le | G11C 17/16 257/530 |
| 8,184,465 B2 | | 5/2012 | Tonti et al. | |
| 8,946,000 B2 | * | 2/2015 | Reber | H01L 23/5258 257/529 |
| 2002/0127765 A1 | * | 9/2002 | Richard | H01L 23/488 438/91 |
| 2007/0284693 A1 | * | 12/2007 | Kim | H01L 23/5256 257/529 |
| 2011/0156858 A1 | * | 6/2011 | Poppe | G11C 17/16 337/414 |
| 2012/0129319 A1 | | 5/2012 | Cestero et al. | |
| 2012/0327700 A1 | * | 12/2012 | Li | G11C 17/16 365/104 |
| 2014/0061851 A1 | * | 3/2014 | Lin | H01L 27/101 257/529 |
| 2015/0076656 A1 | * | 3/2015 | Kwon | H01L 23/3677 257/529 |

(Continued)

OTHER PUBLICATIONS

Kothandaraman et al, "Electrically Programmable Fuse (eFUSE) Using Electromigration in Sllicides," IEEE Electron Device Letters, vol. 23(9), Sep. 2002, p. 523-525.

(Continued)

*Primary Examiner* — Anatoly Vortman
*Assistant Examiner* — Stephen Sul
(74) *Attorney, Agent, or Firm* — Wells St. John P.S.

(57) ABSTRACT

Some embodiments include a fuse element assembly having a first portion configured to rupture as materials of the first portion flow to a second portion through electromigration. The assembly has a second portion configured to accumulate the materials that have flowed from the first portion. The assembly also has a control element configured to divide the flow of materials into at least two paths along the second portion. The first portion may be a fuse-link and the second portion may be a cathode coupled to the fuse-link through a narrow neck region. The control element may be, for example, a slit, a hole, a conductive contact, etc.

11 Claims, 12 Drawing Sheets

(56) References Cited

U.S. PATENT DOCUMENTS

| 2015/0206603 A1* | 7/2015 | Choi | H01L 23/5256 |
| | | | 257/529 |
| 2015/0214149 A1* | 7/2015 | Moy | H01L 23/5256 |
| | | | 324/762.01 |

OTHER PUBLICATIONS

Tonti et al., "Product Specific Sub-Micron E-Fuse Reliability and Design Qualification," IBM Engineering and Technology Services, 2003 IEEE IRW Final Report, p. 36-40.

* cited by examiner

FUSE ELEMENT ASSEMBLIES

TECHNICAL FIELD

Fuse element assemblies.

BACKGROUND

E-fuses may be incorporated into integrated circuitry, and may serve numerous functions. For example, E-fuses may provide overcurrent and/or overvoltage protection. As another example, E-fuses may be utilized in conjunction with redundant circuitry to reroute current flow onto a redundant path in the event that faulty circuitry is identified on a primary path subsequent to a manufacturing process.

E-fuses may comprise a fuse-link between an anode and a cathode. In operation, the fuse-link may be ruptured by electromigration of material from the fuse-link to the cathode when electrical characteristics (e.g., current flow, voltage differential, etc.) across the fuse-link exceed a predetermined threshold.

Problems may occur during operation of E-fuses in that material from the fuse-link accumulates at the cathode as the fuse-link is ruptured, and such accumulating material may cause cracks or other defects to develop in structures adjacent the cathode. It would be desirable to develop new E-fuse configurations which alleviate or prevent such problems.

DETAILED DESCRIPTION OF THE ILLUSTRATED EMBODIMENTS

In some embodiments, the invention includes new fuse element (e.g., E-fuse) configurations which are designed to more uniformly spread accumulating material across a cathode as compared to conventional fuse element configurations. The improved spreading of the accumulating material may reduce a thickness of the accumulating material as compared to conventional fuse element configurations. Such reduced thickness of the accumulating material may alleviate or prevent undesired effects of the accumulating material on structures adjacent the E-fuse as compared to conventional fuse element configurations. For instance, cracking and/or other defects may be alleviated or prevented. Example embodiments are described with reference to FIGS. 1-20.

Figure 1:
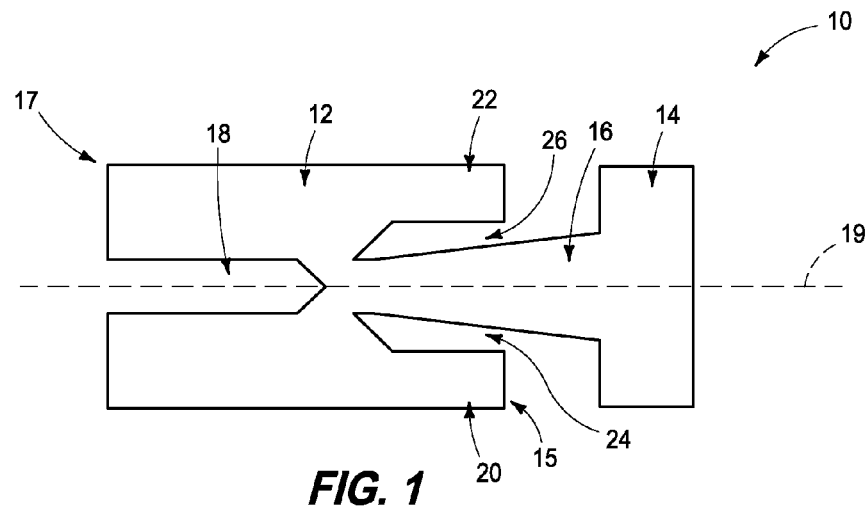
FIG. 1 is a diagrammatic top view of an example embodiment fuse element assembly.

Referring to FIG. 1, an example embodiment fuse element configuration 10 is shown to comprise a cathode 12, an anode 14, and a fuse-link 16 between the cathode and the anode. In some embodiments, the fuse-link may be considered an example of a first portion of the fuse element configuration 10, the cathode may be considered an example of a second portion, and the anode may be considered an example of a third portion. Unlike a conventional fuse element configuration, the configuration 10 includes a slit 18 extending into the cathode 12.

In the illustrated configuration, the cathode 12 comprises a first side 15 along the fuse-link 16, and comprises a second side 17 in opposing relation to the first side. The slit 18 extends into the cathode 12 from the second side 17.

In the shown embodiment, the fuse-link 16 tapers from the anode 14 to the cathode 12 so that the fuse-link couples to the cathode through a narrow neck region. During operation of the fuse element, current density in the narrow neck region of the fuse-link may be higher than in wider regions of the fuse-link more distal from the cathode. Such may advantageously cause rupture of a fuse-link formed in accordance with the illustrated embodiment to reproducibly occur in the region near the cathode rather than in regions more distal from the cathode, which may improve reliability and performance of the example embodiment fuse element as compared to conventional configurations. The current density across the narrow neck region of the fuse-link may be imparted by, for example, direct current (DC), pulse current, etc. It may be desired to have a smooth bend (or other transition) where the fuse-link joins the anode in order to achieve smooth electron flow, and to avoid undesired build-up of current concentration at the interface of the fuse-link and anode.

The illustrated fuse element configuration 10 has mirror symmetry along a plane 19 which bifurcates the fuse element into two halves.

The cathode 12 comprises a pair of projections 20 and 22 which extend along opposing sides of the fuse-link 16. The projections 20 and 22 are spaced from the fuse-link by gaps 24 and 26. In some embodiments, the illustrated fuse-link may be considered to have a relatively wide region adjacent anode 14, and a relatively narrow region adjacent cathode 12, and the illustrated projections 20 and 22 may be considered to extend along opposing sides of the relatively narrow region.

Figure 2:
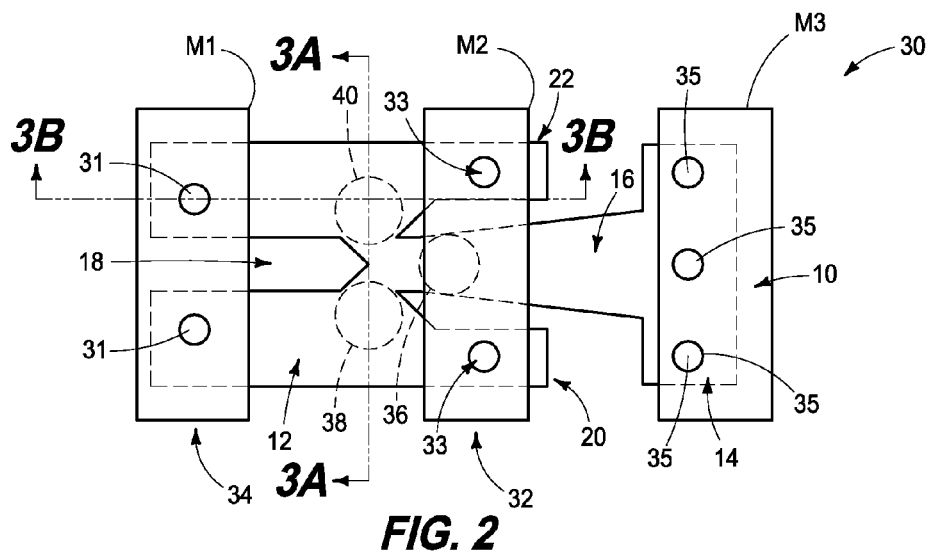
FIG. 2 is a diagrammatic top view of the example embodiment fuse element assembly of FIG. 1 incorporated into an example embodiment circuit assembly.

FIG. 2 shows the fuse element 10 incorporated into an assembly 30 (i.e., a fuse element assembly) comprising three different wirings M1, M2 and M3 (which may be considered to comprise three separate electrodes in some embodiments). The wirings M1 and M2 are coupled to the cathode 12 through contacts 31 and 33, respectively; and the wiring M3 is coupled to the anode through contacts 35. The illustrated contacts are example configurations, and the total number of contacts, locations of the contacts, and sizes of contacts may vary in other embodiments. The wirings may comprise any suitable conductive material (for example, tungsten, etc.).

In the illustrated embodiment, the cathode 12 may be considered to comprise a first region 32 comprising projections 20 and 22, and a second region 34 offset from the first region. The wiring M2 may be considered to be first wiring connected to the first region 32 of the cathode, and the wiring M1 may be considered to be second wiring connected to the second region 34 of the cathode. The first and second wirings may be configured to be operated independently of one another for providing a pulse train to impart rupture of the fuse-link 16, as described in more detail below with reference to FIGS. 4 and 5.

The slit 18 within the assembly 30 of FIG. 2 may be considered to be an example of a control element that modifies flow of transferred material during rupture of the fuse-link 16, and which directs the transferred material along two or more paths across the cathode to reduce an overall height of the material accumulating on the cathode. For instance, during operation of assembly 30 the fuse-link 16 may be ruptured within an illustrated rupture-region 36 due to electromigration of material from such rupture-region to the cathode 12. The slit 18 may disperse flow of the electromigrating material along two paths so that the material accumulates in two locations 38 and 40. Conventional fuse element assemblies lack a control element to modify flow of transferred material along the cathode, and thus transferred material accumulates in a single location. A volume of material accumulating in a single location will form a higher mound as compared to a same volume accumulating in two or more locations. Accordingly, the illustrated embodiment of FIG. 2 may reduce an overall height of the accumulating material on cathode 12 during fuse-rupture as compared to conventional fuse element assemblies. Such reduced overall height may lead to reduced stresses on structures adjacent the fuse element assembly, which may alleviate or prevent cracking and/or other problems associated with the operation of conventional fuse element assemblies. In some embodiments, the right-most region of slit 18 may overlap a region where transferred material would accumulate in the absence of the slit so that the slit extends across an optimum location for redirecting the transferred material.

Figure 3A:
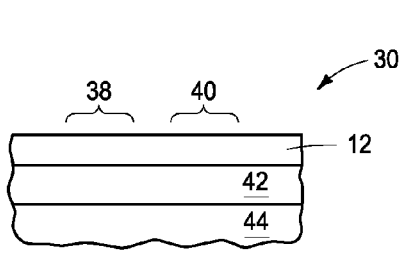
FIG. 3A is a diagrammatic cross-sectional side view along the line 3A-3A of FIG. 2.
Figure 3B:
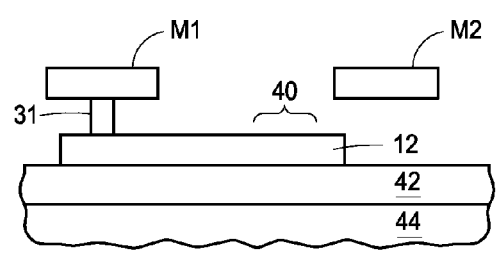
FIG. 3B is a diagrammatic cross-sectional side view along the line 3B-3B of FIG. 2.

FIGS. 3A and 3B show cross-sections along the cathode 12 of fuse element assembly 30 in crossing directions, and show the accumulation regions 38 and 40 laterally spread apart from one another. The cross-sections of FIGS. 3A and 3B also show that the cathode 12 may be formed over an insulative material 42, which in turn is formed over a semiconductor substrate 44.

The insulative material 42 may comprise any suitable composition or combination of compositions, including, for example, one or more of silicon dioxide, silicon nitride, borophosphosilicate glass, fluorosilicate glass, etc.

The semiconductor substrate 44 may comprise any suitable semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The cathode 12 may comprise any suitable material, and some embodiments may comprise one or more of conductively-doped silicon, metal, etc. For instance, in some embodiments the cathode may comprise a layer of metal or metal-containing composition (for instance, metal silicide) over a layer of conductively-doped silicon; in some embodiments the cathode may comprise only metal or metal-containing material; etc. The anode 14 and fuse-link 16 (FIG. 2) may comprise the same composition as the cathode 12 in some embodiments; and in other embodiments one or both of the anode and fuse-link may comprise a different composition than the cathode.

Figure 4:
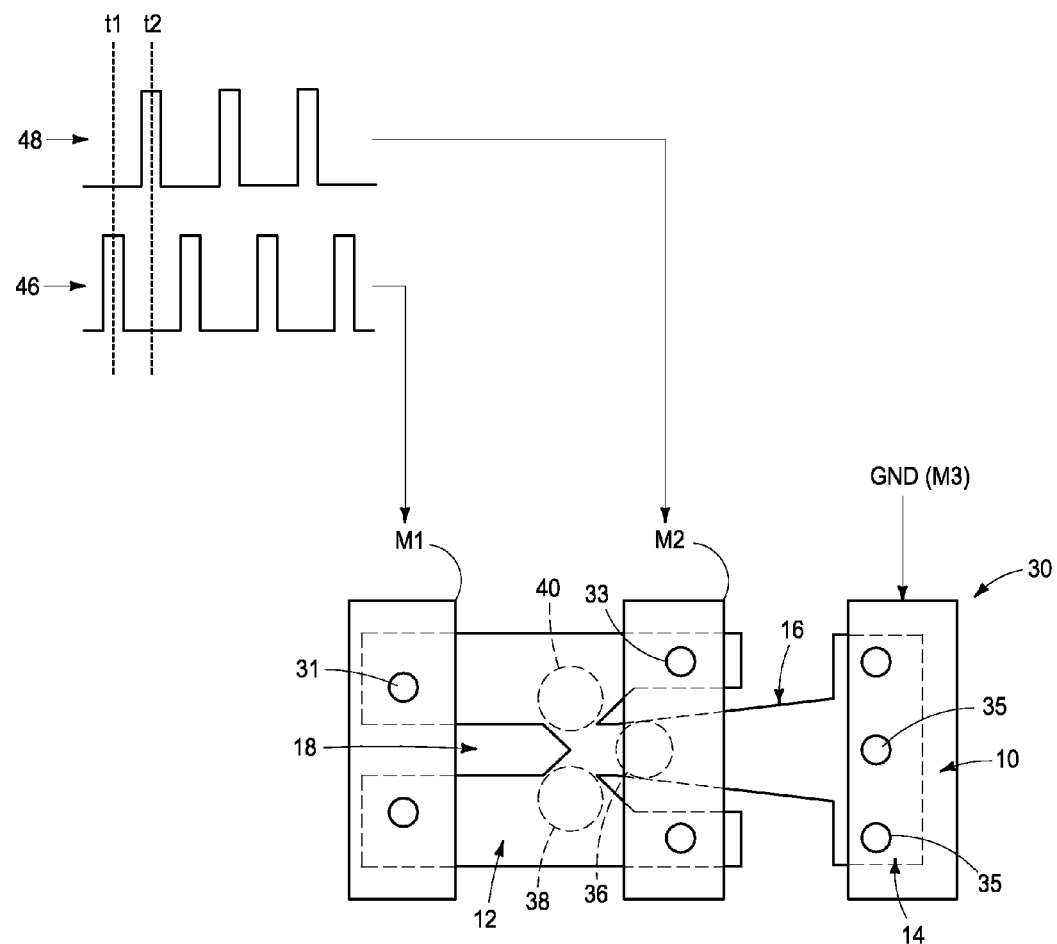
FIG. 4 diagrammatically illustrates an example pulse sequence that may be utilized relative to the circuit assembly of FIG. 2 to rupture a fuse-link of the fuse element assembly.

FIG. 4 shows an example pulse sequence that may be utilized for rupturing fuse-link 16 and causing electromigration of material from the rupture-region 36 of the fuse-link to the accumulation regions 38 and 40 of the cathode 12. The pulse sequence includes a set of pulses 46 imparted to wiring M1, a set of pulses 48 imparted to wiring M2; and ground (GND), or other suitable static condition, at wiring M3. The pulses 46 and 48 establish a pulse train. When the voltage at wiring M1 is at a high level at time t1, migration proceeds between the wiring M1 and the fuse-link 16; and when the wiring M2 is at the high level at time t2, migration proceeds between the wiring M2 and the fuse-link 16. The train of pulses may be tailored to achieve desired properties (for instance, to achieve a short OFF period of current in the fuse-link). Utilization of two pulses may enable the cathode 12 to cool between pulses, while keeping the fuse-link hot. Such may enable rupture to be induced within the fuse-link without overheating the cathode.

Figure 5:
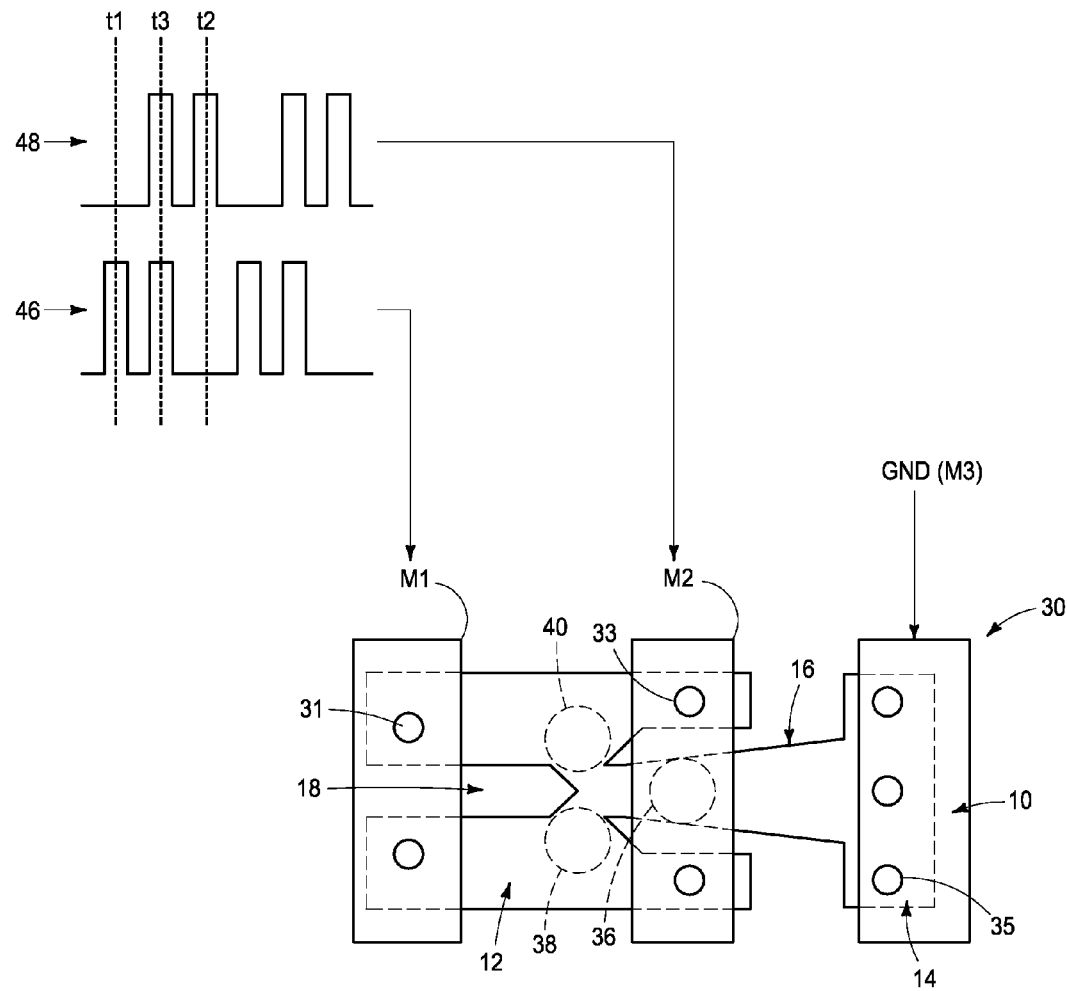
FIG. 5 diagrammatically illustrates another example pulse sequence that may be utilized relative to the circuit assembly of FIG. 2 to rupture a fuse-link of the fuse element assembly.

The pulse sequence of FIG. 4 is an example sequence, and numerous other sequences may be utilized in other embodiments. For instance, FIG. 5 shows another example pulse sequence. The sequence of FIG. 5 includes high-level pulses on both of wirings M1 and M2 at time t3 which may induce electromigration of material across an entirety of cathode 12. Some example operating conditions may include:

M1:3V, M2:0V—migration direction: M1

M1:0V, M2:3V—migration direction: M2

M1:3V, M2:3V—migration direction: intermediate between M1 and M2

In some embodiments, a degree of overlap voltages between wirings M1 and M2 may be designed as an analog triangular waveform rather than as a digital rectangular waveform. Some example operating conditions may include:

M1:3V, M2:1V—migration direction: between M1 and M2, closer to M1

M1:1V, M2:3V—migration direction: between M1 and M2, closer to M2

Figure 6:
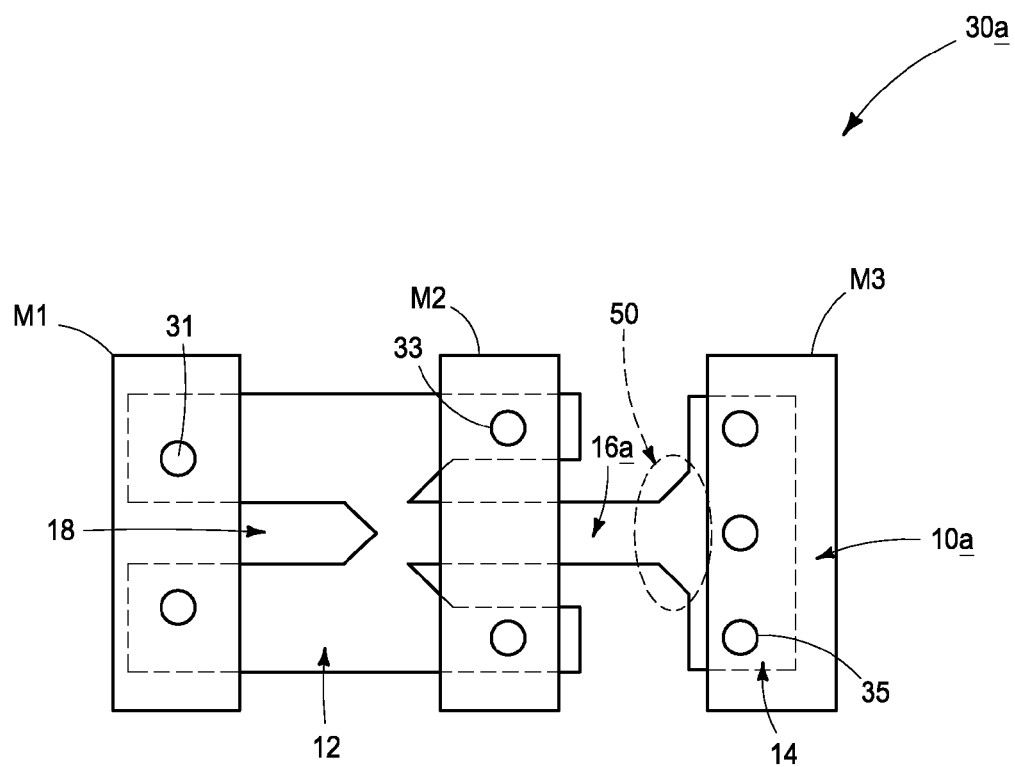
FIG. 6 is a diagrammatic top view of another example embodiment fuse element assembly incorporated into another example embodiment circuit assembly.

The fuse element 10 of FIGS. 1-5 includes a fuse-link 16 having a uniform taper from anode 14 to cathode 12. In other embodiments, the fuse-link may have other configurations in order to achieve the desired relatively narrow region adjacent cathode 12 and relatively wide region adjacent anode 14. For instance, FIG. 6 shows an assembly 30a having a fuse element 10a in which the fuse-link 16a is triangle-shaped in a region 50 adjacent the anode 14.

Figure 7:
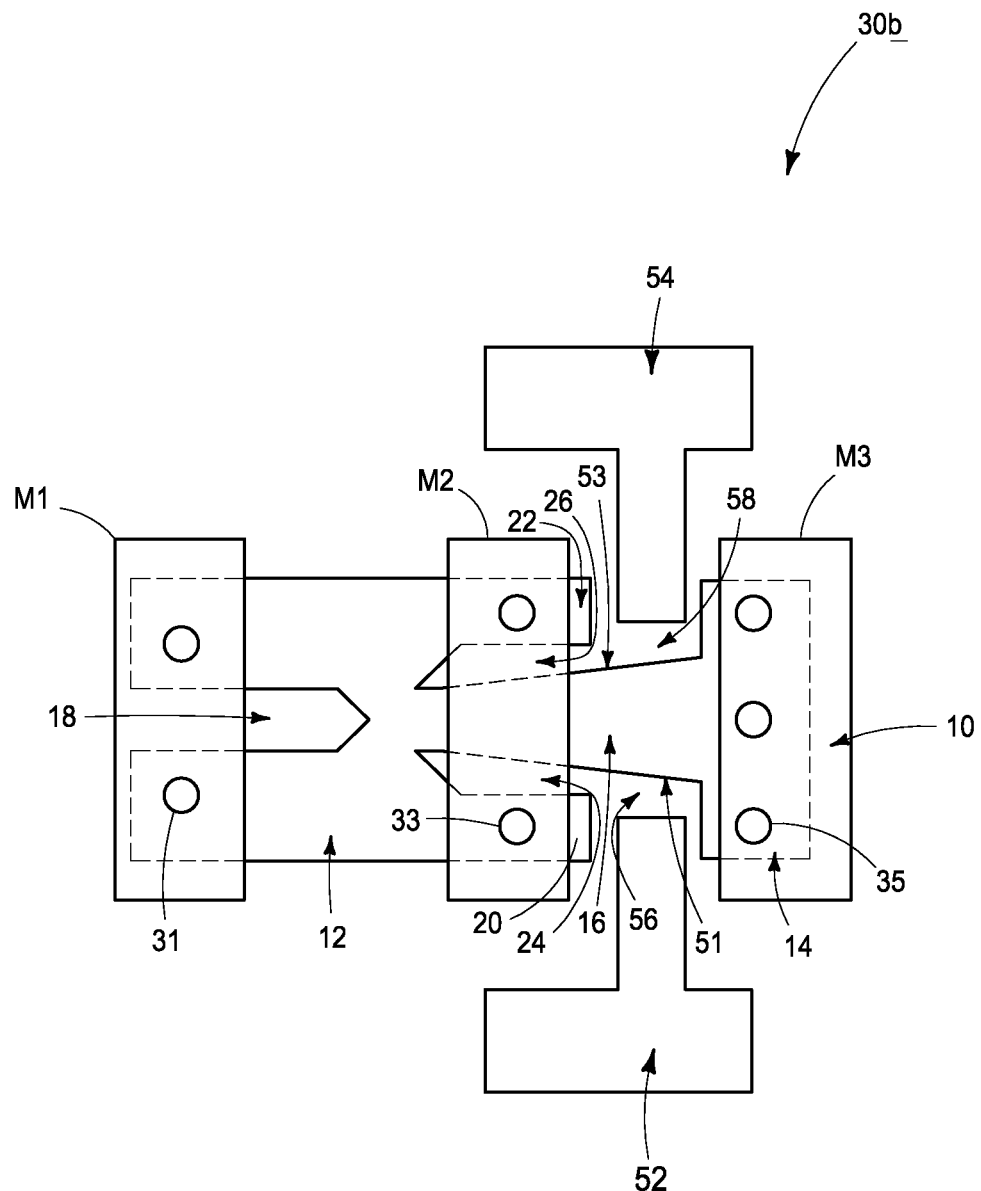
FIG. 7 is a diagrammatic top view of the example embodiment fuse element assembly of FIG. 1 incorporated into another example embodiment circuit assembly.

In some embodiments it is recognized that it may be difficult to fabricate a fuse-link having a desired shape due to light-interference and/or other problems that may manifest during the patterning of such desired shape. FIG. 7 illustrates a potential solution to such fabrication difficulties. Specifically, FIG. 7 shows an assembly 30b having dummy elements 52 and 54 provided adjacent the fuse-link 16 to assist during fabrication of such fuse-link. The elements are referred to as "dummy" elements to indicate that they have no function in the integrated circuit, but rather are provided solely to assist during the patterning of fuse element 10. The dummy elements may comprise any suitable composition or combination of compositions, including, for example silicon dioxide, silicon nitride, silicon, metal, etc. Although the illustrated elements 52 and 54 are described as dummy elements; in other embodiments one or both of the elements 52 and 54 may be a circuit element rather than a dummy element.

In the shown embodiment of FIG. 7, the fuse-link 16 comprises a pair of opposing sidewalls 51 and 53 that extend from anode 14 to cathode 12. Such sidewalls may be referred to as a first sidewall and a second sidewall, respectively. The dummy features 52 and 54 may be referred to as first and second dummy features that are along the first and second sidewalls, respectively. The first dummy feature 52 is spaced from the first sidewall 51 by a first gap 56, and the second dummy feature 54 is spaced from the second sidewall 53 by a second gap 58. The embodiment of FIG. 7 has the gap 24 between projection 20 and fuse-link 16, and has the gap 26 between projection 22 and the fuse-link 16. The gaps 24 and 26 may be referred to as third and fourth gaps.

Figure 8:
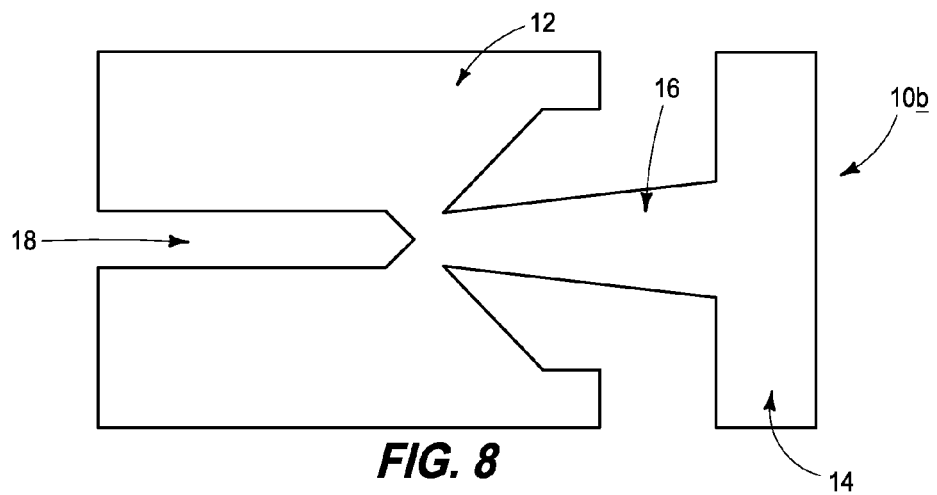
FIG. 8 is a diagrammatic top view of another example embodiment fuse element assembly.

The fuse element 10 of FIG. 1 is an example configuration, and other configurations may be utilized in other embodiments. For instance, FIG. 8 shows a fuse element 10b having a slightly different configuration than the fuse element 10 of FIG. 1. The fuse element 10b is used in describing example embodiments shown in FIGS. 9, 11, 13 and 15.

Figure 9:
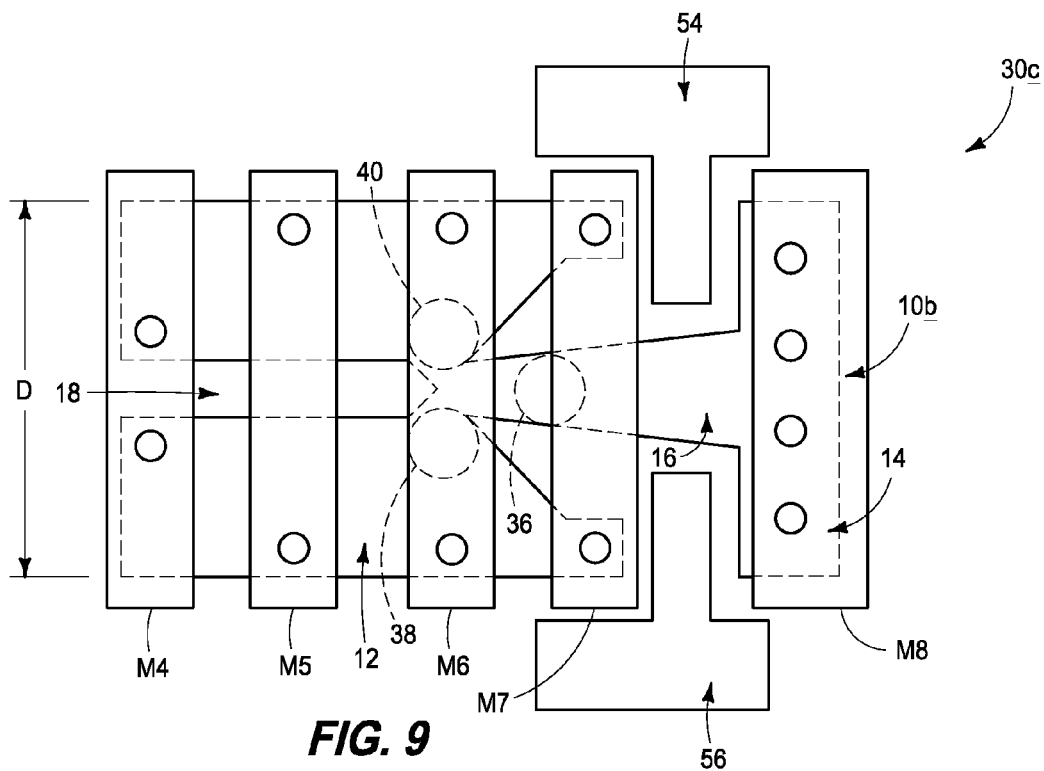
FIG. 9 is a diagrammatic top view of the example embodiment fuse element assembly of FIG. 8 incorporated into an example embodiment circuit assembly.

Referring to FIG. 9, an assembly 30c is shown to comprise multiple wirings (or electrodes) M4, M5, M6 and M7 in contact with cathode 12, and to comprise wiring M8 in contact with anode 14. The wiring M8 may be analogous to the wiring M3 described above with reference to FIG. 2. The wirings M4, M5, M6 and M7 may be considered to comprise first and second wirings (for instance M4 and M7) analogous to the wirings M1 and M2 of FIG. 2, and to further comprise additional wirings (for instance, M5 and M6). Utilization of multiple wirings coupled with the cathode may enable the pulse train utilized for rupturing the fuse-link to be tailored for particular applications. An advantage of utilizing a larger number of wirings in contact with the cathode is that the pulse train may be more finely tailored, but a disadvantage is that the fabrication becomes increasingly complicated with the larger number of wirings. Another advantage is that cooling of cathode 12 through thermal conduction into adjacent wirings may be enhanced by providing a larger number of adjacent wirings.

Figure 10:
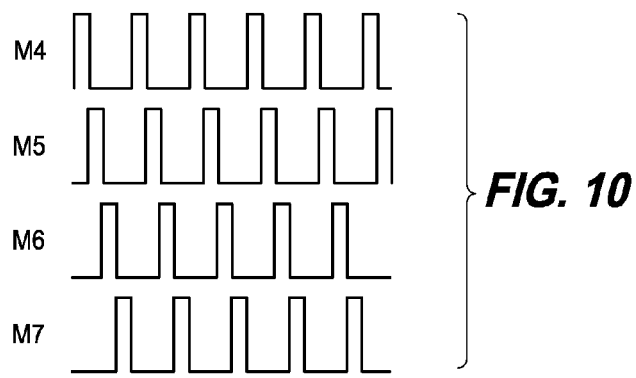
FIG. 10 diagrammatically illustrates an example pulse sequence that may be utilized relative to the circuit assembly of FIG. 9 to rupture a fuse-link of the fuse element assembly.

In the illustrated embodiment of FIG. 9, four wirings (M4, M5, M6 and M7) associated with the cathode may enable concentration points of current density to be dispersed amongst four different times and places. FIG. 10 illustrates an example pulse sequence that may be utilized with the embodiment of FIG. 9 (the wiring M8 is not shown in FIG. 10, and may be maintained at an electrical ground or other suitable static condition). The additional wirings of FIG. 9 relative to those of FIG. 2, and the associated additional pulses that may be interspersed utilizing such additional wirings, may enable better control of assembly 30c of FIG. 9 relative to the assembly 30 of FIG. 2 during rupture of the fuse-link; and specifically may enable such rupture to be achieved with better cooling of the cathode and an accelerated rate of rupture.

Figure 11:
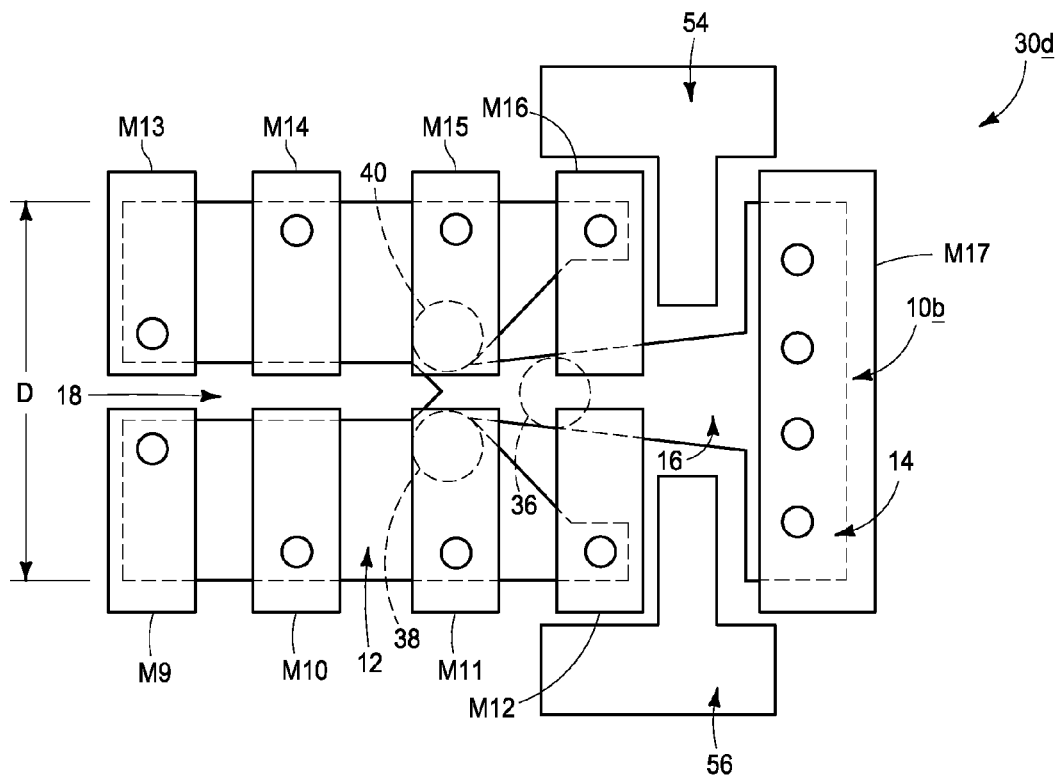
FIG. 11 is a diagrammatic top view of the example embodiment fuse element assembly of FIG. 8 incorporated into another example embodiment circuit assembly.

The wirings associated with cathode 12 of FIGS. 2 and 9 span continuously across an entire width dimension of the cathode. For instance, FIG. 9 shows the cathode having a width dimension D, and shows the wirings M4, M5, M6 and M7 all spanning continuously across the entirety of such width dimension. In other embodiments, wirings are provided in segments which span only a portion of the width dimension of the cathode. For instance, FIG. 11 shows an assembly 30d comprising wirings M9, M10, M11, M12, M13, M14, M15 and M16 coupled with the cathode 12, with each of such wirings being a segment which spans only a portion of the width dimension D of the cathode. The assembly 30d further includes wiring M17 coupled with the anode 14. The wiring M17 may be analogous to the wiring M3 described above with reference to FIG. 2. The wirings M9, M10, M11, M12, M13, M14, M15 and M16 may be considered to comprise first, second, third, fourth, etc. wirings. Utilization of multiple wirings coupled with the cathode may enable the pulse train utilized for rupturing the fuse-link to be tailored for particular applications, analogously to advantages discussed above with reference to FIG. 9.

Figure 12:
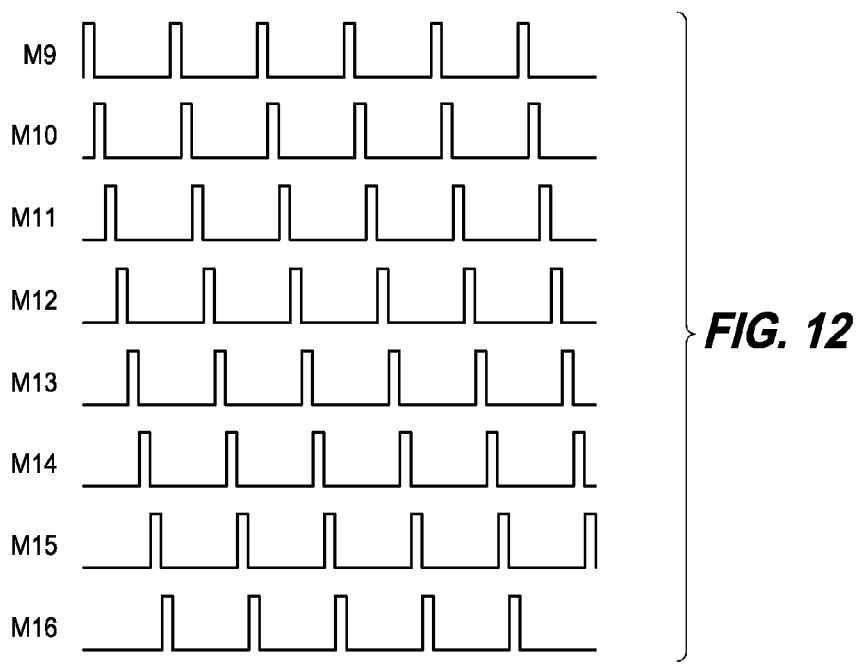
FIG. 12 diagrammatically illustrates an example pulse sequence that may be utilized relative to the circuit assembly of FIG. 11 to rupture a fuse-link of the fuse element assembly.

FIG. 12 illustrates an example pulse sequence that may be utilized with the embodiment of FIG. 11. The eight wirings (M9-M16) associated with the cathode may enable concentration points of current density to be dispersed amongst eight different times and places (eight dispersions). The wiring M17 may be maintained at electrical ground, or other suitable static condition, during the fuse-rupture.

Figure 13:
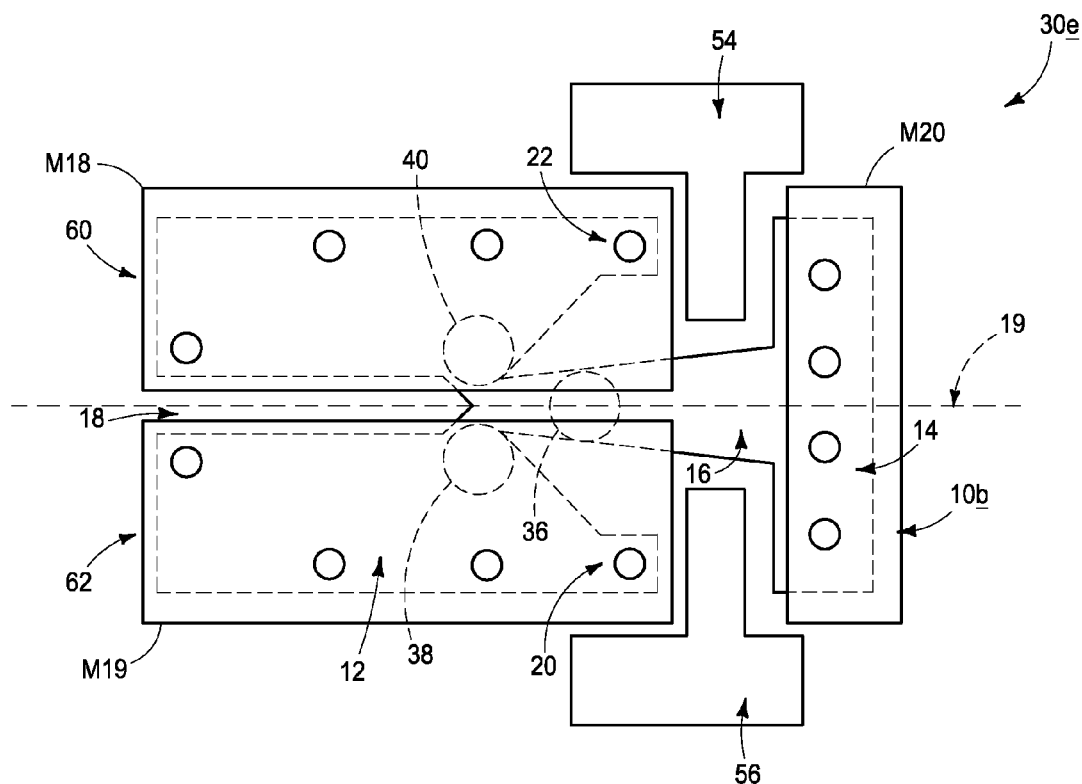
FIG. 13 is a diagrammatic top view of the example embodiment fuse element assembly of FIG. 8 incorporated into another example embodiment circuit assembly.

The embodiments of FIGS. 2, 4, 5, 6, 7, 9 and 11 utilize wirings which divide electron current/migration laterally in view of a time-divided manner initiated by a pulse train. FIG. 13 illustrates an alternative fuse element assembly wherein wiring is configured to divide electron current/migration longitudinally in the view of a time-divided manner initiated by a pulse train. Specifically, FIG. 13 shows a fuse element assembly 30e having wirings M18 and M19 extending longitudinally along cathode 12. Alternatively considered, the cathode 12 may be considered to comprise mirror symmetry along the plane 19. The plane 19 bifurcates the cathode into a first half 60 comprising projection 22, and a second half 62 comprising projection 20. The first wiring M18 is electrically connected to the first half 60, and the second wiring M19 is electrically connected to the second half 62. The first and second wirings may be configured to be operated independently one another for providing a pulse train to impart rupture of fuse-link 16 within the rupture-region 36. Since four contacts are located between each of the wirings M18 and M19 and the cathode, the electron current/migration under each of the wirings may expand into a fan-shape during rupture of the fuse-link. The assembly 30e also comprises a third wiring M20 coupled with the anode 14. Such third wiring may be maintained at ground, or other suitable static condition, during rupture of the fuse-link.

Figure 14:
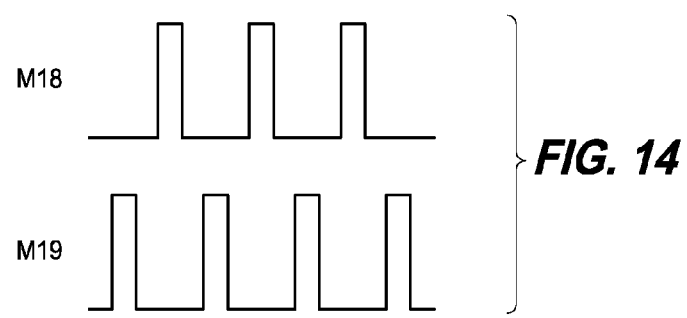
FIG. 14 diagrammatically illustrates an example pulse sequence that may be utilized relative to the circuit assembly of FIG. 13 to rupture a fuse-link of the fuse element assembly.

FIG. 14 illustrates an example pulse sequence that may be utilized with the embodiment of FIG. 13. A high-level voltage may be alternately applied to each of the wirings M18 an M19 to allow electron current to flow therethrough. The utilization of the illustrated wiring configuration may enable the cathode to remain cool during rupture of a fuse-link even though the electron current may flow through the fuse-link for substantial duration so that the fuse-link may stay hot. Specifically, current is pulsed alternately on opposing halves of the cathode to enable each half to alternately heat and cool, and yet the current remains relatively steady on the fuse-link to keep the fuse-link hot.

Figure 15:
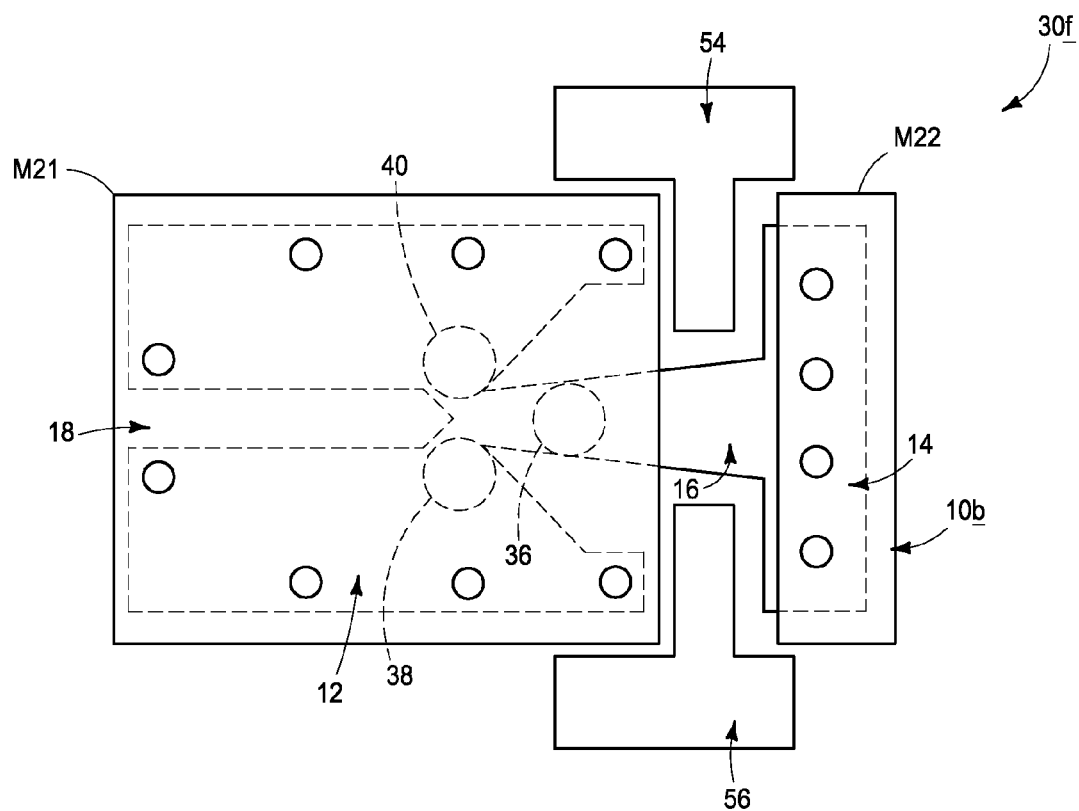
FIG. 15 is a diagrammatic top view of the example embodiment fuse element assembly of FIG. 8 incorporated into another example embodiment circuit assembly.

FIG. 15 illustrates a fuse element assembly 30f illustrating another example embodiment. Specifically, a single wiring M21 extends across the entirety of cathode 12, and another wiring M22 extends across anode 14. It may be simpler to fabricate the embodiment of FIG. 15 having only two wirings, as compared to some of the other embodiments described herein which comprise multiple wirings. The embodiment of FIG. 15 may be useful in applications in which a relatively simple pulse train may be utilized to rupture fuse-link 16 while maintaining desired performance characteristics.

Figure 16:
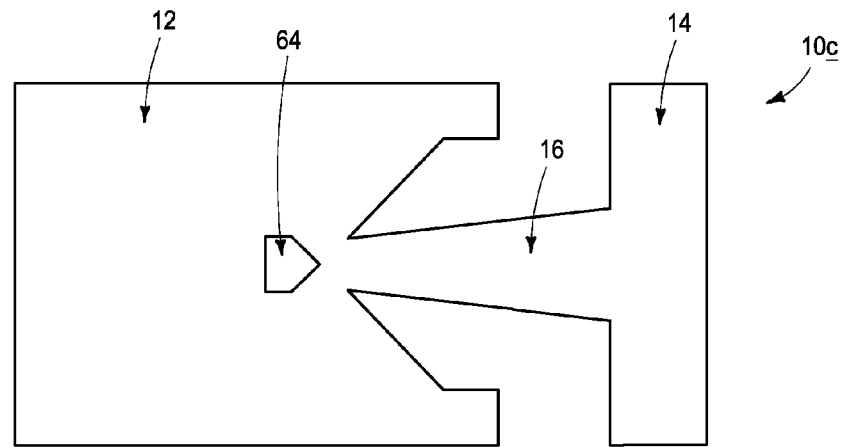
FIG. 16 is a diagrammatic top view of another example embodiment fuse element assembly.

The slit 18 of the fuse element 10 of FIG. 1 and the fuse element 10b of FIG. 8 is an example control element which may be utilized to modify flow of transferred material along a cathode during fuse rupture. FIG. 16 shows a fuse element 10c having a different configuration; and specifically shows a control element corresponding to a hole 64 extending through the cathode 12. The hole may have any suitable shape; and may, for example, be elliptical, circular, home-based-shaped, rectangular, polygonal, square, etc. The hole is entirely laterally surrounded by conductive material of the cathode 12. The hole may be filled with solid or semisolid insulative material (e.g., silicon dioxide, silicon nitride, etc.).

Figure 17:
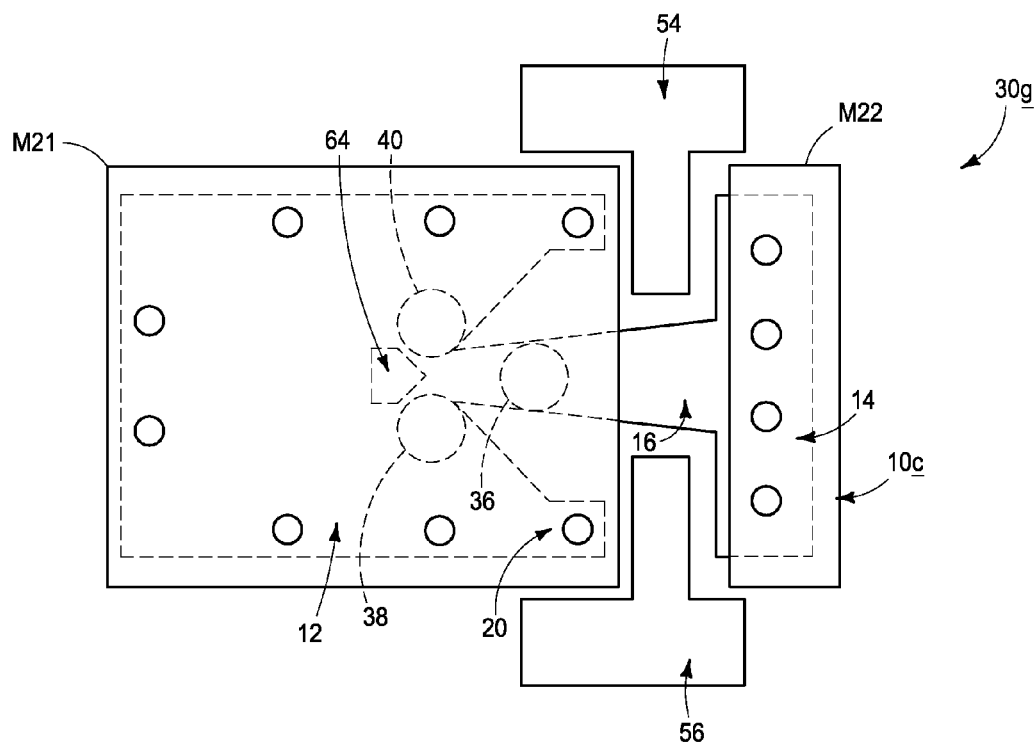
FIG. 17 is a diagrammatic top view of the example embodiment fuse element assembly of FIG. 16 incorporated into an example embodiment circuit assembly.

FIG. 17 shows the fuse element 10c incorporated into a fuse element assembly 30g comprising wirings M21 and M22 of the type described above with reference to FIG. 15. In other embodiments, other wiring configurations may be utilized, including, for example, any of the other wiring configurations described above with reference to FIGS. 2 and 4-14. The hole 64 may be placed in a location where transferred material from fuse-link 16 would accumulate in the absence of such hole. In the illustrated embodiment, the hole 64 redirects accumulating material into locations 38 and 40 (i.e., directs the accumulating material into two paths, one of which leads to location 38 and the other of which leads to location 40).

Figure 18:
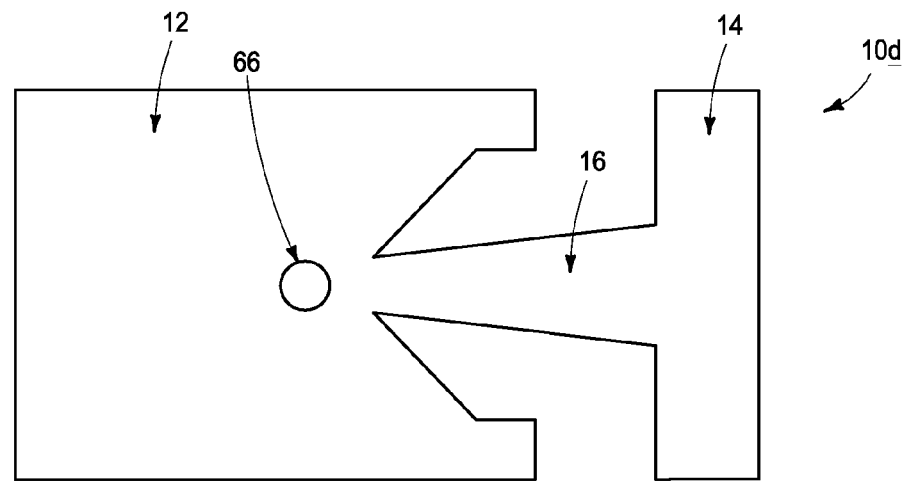
FIG. 18 is a diagrammatic top view of another example embodiment fuse element assembly.

The hole 64 of FIG. 17, and slits 18 of FIGS. 1 and 8, are examples of static control elements (i.e., control elements which remain the same in all operational phases of the fuse elements). Another type of control element which may be utilized in some embodiments is a non-static control element, such as, for example, a control element which is charged in some operational states of the fuse element. FIG. 18 shows a fuse element 10d comprising an electrically conductive contact 66 incorporated into a control element. In some embodiments, electrical pulses are provided to the contact during operation of the fuse element.

Figure 19:
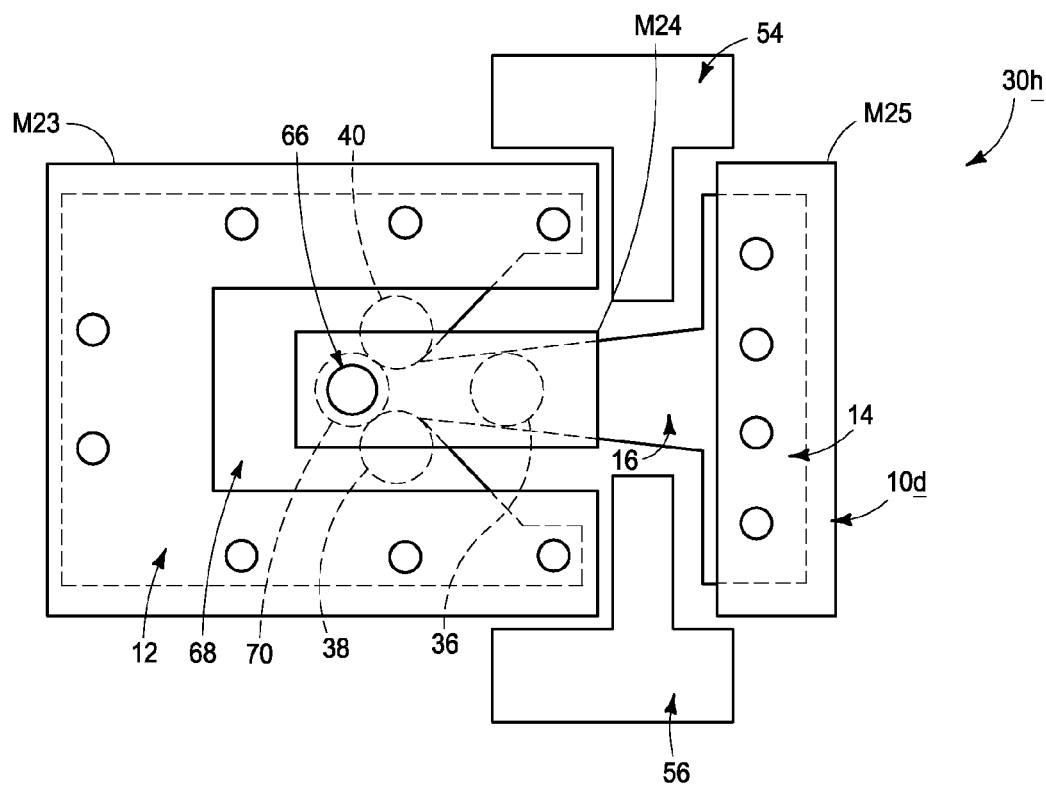
FIG. 19 is a diagrammatic top view of the example embodiment fuse element assembly of FIG. 18 incorporated into an example embodiment circuit assembly.

FIG. 19 shows the fuse element 10d incorporated into a fuse element assembly 30h comprising wirings M23, M24 and M25. The wiring M23 is coupled with cathode 12 and the wiring M25 is coupled with anode 14. The wiring M24 is coupled with the electrically conductive contact 66, and may be utilized to impart electrical current and/or potential across an interface between the contact 66 and the cathode 12. In the illustrated embodiment, the wiring M24 is electrically isolated from the wiring M23 by an insulative region 68. Such insulative region may comprise any suitable composition or combination of compositions; and may, for example, comprise one or both of silicon nitride and silicon dioxide.

Figure 20:
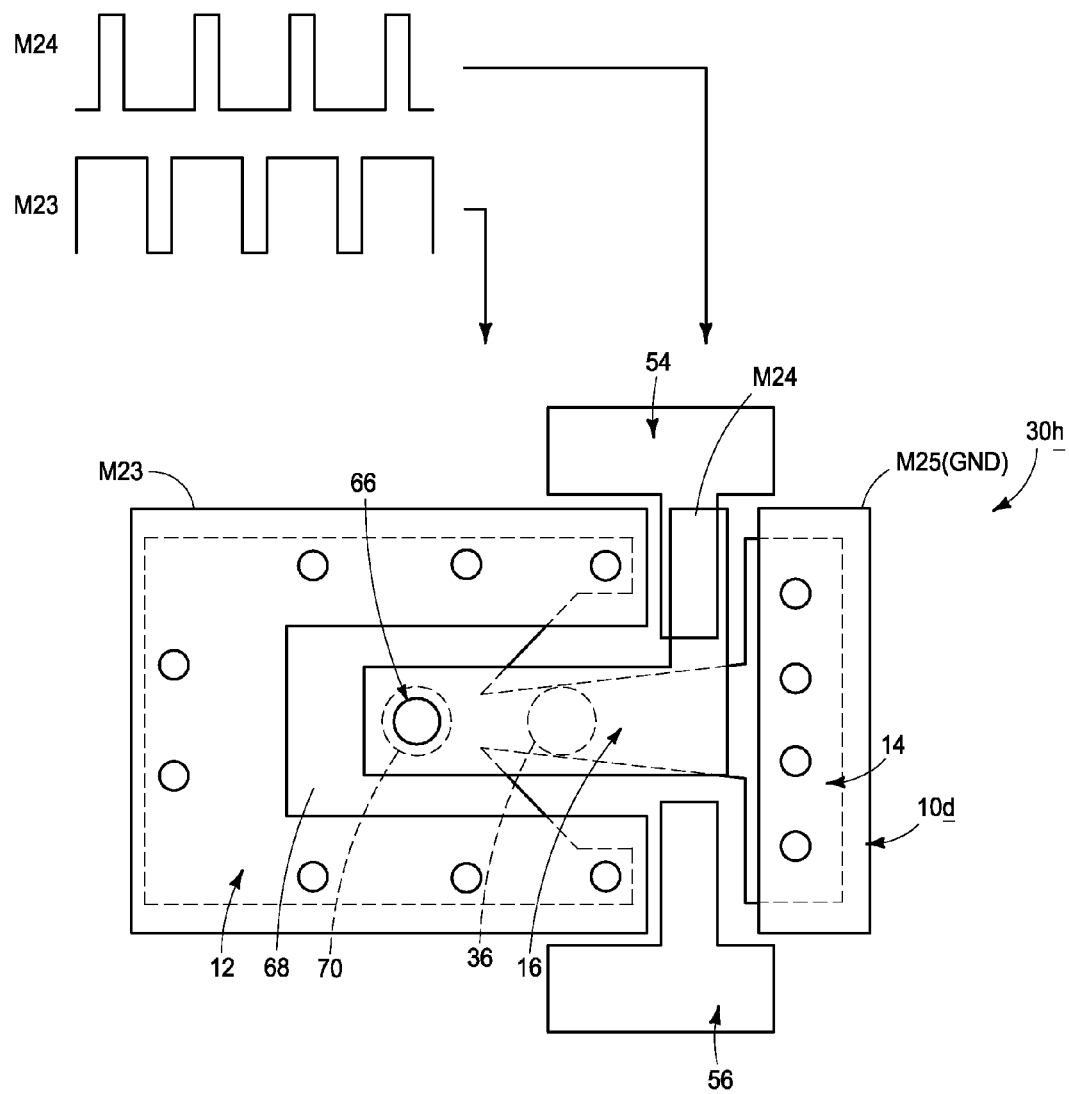
FIG. 20 diagrammatically illustrates an example pulse sequence that may be utilized relative to the circuit assembly of FIG. 19 to rupture a fuse-link of the fuse element assembly.

In operation, an electrically-altered region 70 may be formed around contact 66 utilizing electrical potential and/or current flow generated with wiring M24. In some embodiments, the contact 66 (specifically, the electrically-altered region 70) may redirect accumulating material into locations 38 and 40 (i.e., directs the accumulating material into two paths, one of which leads to location 38 and the other of which leads to location 40). In some embodiments, the contact 66 may be electrically floating. In some embodiments, the contact 66 may have a voltage of opposite polarity (i.e., reverse relation) to that utilized to induce rupture of fuse-link 16, and such opposite polarity may redirect accumulating material along two or more paths to reduce a height of the accumulating material (i.e., to flatten the accumulating material). FIG. 20 illustrates a pulse sequence which may be utilized relative to wirings M23 and M24 to induce a reverse flow of electrons within the region 70 (i.e., a region proximate the contact 66) as compared to the general flow of the electrons utilized to rupture the fuse-link 16. The overall influence of electrical flow along contact 66 on the migration of accumulating material may be tailored by modifying the amplitude, duration and/or overall shape of pulses provided at the contact 66 through wiring M24.

Although the embodiments described herein specifically show accumulating material on cathode 12 divided amongst two paths (a path leading to region 38, and another path leading to region 40) utilizing the illustrated control elements, in other embodiments control elements may be configured to direct accumulating material along more than two paths.

The fuse elements and fuse element assemblies discussed above may be utilized in electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

Some embodiments include a fuse element assembly (e.g., 30, 30*a-h*) comprising a first portion (e.g., 16, 16*a*) configured to be ruptured as materials of the first portion flow to a second portion (e.g., 12) through electromigration. The second portion is configured to accumulate the materials that have flowed from the first portion. The assembly includes a control element (e.g., slit 18, hole 64, contact 66) configured to divide the flow of materials into at least two paths along the second portion.

Some embodiments include a fuse element assembly (e.g., 30, 30*a-h*) comprising an anode (e.g., 14), a cathode (e.g., 12), a fuse-link (e.g., 16, 16*a*) between the anode and the cathode and configured to rupture during transfer of material from the fuse-link into the cathode, and a control element (e.g., slit 18, hole 64, contact 66) modifying flow of the transferred material along the cathode.

Some embodiments include a fuse element assembly (e.g., 30, 30*a-h*) comprising an anode (e.g., 14), a cathode (e.g., 12), and a fuse-link (e.g., 16, 16*a*) between the anode and the cathode. The fuse-link is configured to rupture during transfer of material from the fuse-link into the cathode. The fuse-link has a relatively narrow region adjacent the cathode and a relatively wide region adjacent the anode. The cathode has a pair of projections (e.g., 20, 22) that extend along opposing sides of the relatively narrow region and that are spaced from the relatively narrow region by gaps (e.g., 24, 26). The assembly includes a control element (e.g., slit 18, hole 64, contact 66) which modifies flow of the transferred material along the cathode and which disperses said flow along at least two paths.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A fuse element assembly comprising:
   an anode
   a cathode
   a fuse-link between the anode and the cathode, the fuse-link being configured to rupture during transfer of material from the fuse-link into the cathode; the fuse-link having a relatively narrow region adjacent the cathode and a relatively wide region adjacent the anode; the cathode having a pair of projections that extend along opposing sides of the relatively narrow region and that are spaced from the relatively narrow region by gaps;
   a control element modifying flow of the transferred material along the cathode and dispersing said flow along at least two paths; and
   wherein the cathode has a first region comprising the projections and a second region offset from the first region, and further comprising first wiring connected to the first region and second wiring connected to the second region, the first and second wirings being configured to be operated independently of one another for providing a pulse train to impart rupture of the fuse-link.

2. The fuse element assembly of claim 1 wherein each of the first and second wirings is continuous across an entire width dimension of the cathode.

3. The fuse element assembly of claim 1 wherein each of the first and second wirings is segments spanning only a portion of a width dimension of the cathode.

4. The fuse element assembly of claim 1 further comprising one or more additional wirings connected to the second region and configured to be operated independently of the first and second wirings for providing the pulse train.

5. The fuse element assembly of claim 1 wherein the cathode has a first side adjacent the fuse-link and a second side in opposing relation to the first side, and wherein the control element includes a slit extending into the cathode from the second side.

6. The fuse element assembly of claim 5 wherein the fuse-link is triangle-shaped in a region adjacent the anode.

7. The fuse element assembly of claim 5 wherein the gaps between the projections and the relatively narrow region of the fuse-link are third and fourth gaps; wherein the fuse-link has a pair of opposing sidewalls extending from the anode to the cathode; said opposing sidewalls being a first sidewall and a second sidewall; and further comprising a first dummy feature along the first sidewall and a second dummy feature along the second sidewall; the first and second dummy features being spaced from the first and second sidewalls by first and second gaps, respectively.

8. The fuse element assembly comprising:
   an anode
   a cathode
   a fuse-link between the anode and the cathode, the fuse-link being configured to rupture during transfer of material from the fuse-link into the cathode; the fuse-link having a relatively narrow region adjacent the cathode and a relatively wide region adjacent the anode; the cathode having a pair of projections that extend along opposing sides of the relatively narrow region and that are spaced from the relatively narrow region by gaps;
   a control element modifying flow of the transferred material along the cathode and dispersing said flow along at least two paths; and
   wherein the cathode has mirror symmetry along a plane which bifurcates the cathode into a first half comprising one of the projections and a second half comprising the other of the projections, and further comprising first wiring connected to the first half and second wiring connected to the second half, the first and second wirings being configured to be operated independently of one another for providing a pulse train to impart rupture of the fuse-link.

9. The fuse element assembly of claim 8 wherein the cathode has a first side adjacent the fuse-link and a second side in opposing relation to the first side, and wherein the control element includes a slit extending into the cathode from the second side.

10. A fuse element assembly comprising:
    a first portion;
    a second portion;
    a fuse-link between the first and second portions, the fuse-link being configured to rupture during transfer of material from the fuse-link into the second portion; the fuse-link having a relatively narrow region adjacent the second portion and a relatively wide region adjacent the first portion; the second portion having a pair of projections that extend along opposing sides of the relatively narrow region and that are spaced from the relatively narrow region by gaps;

a control element modifying flow of the transferred material along the second portion and dispersing said flow along at least two paths; and wherein the second portion has a first region comprising the projections and a second region offset from the first region, and further comprising first wiring connected to the first region and second wiring connected to the second region, the first and second wirings being configured to be operated independently of one another for providing a pulse train to impart rupture of the fuse-link.

11. A fuse element assembly comprising:

a first portion;

a second portion;

a fuse-link between the first and second portions, the fuse-link being configured to rupture during transfer of material from the fuse-link into the second portion; the fuse-link having a relatively narrow region adjacent the second portion and a relatively wide region adjacent the first portion; the second portion having a pair of projections that extend along opposing sides of the relatively narrow region and that are spaced from the relatively narrow region by gaps;

a control element modifying flow of the transferred material along the second portion and dispersing said at least two paths; and wherein the second portion has mirror symmetry along a plane which bifurcates the second portion into a first half comprising one of the projections and a second half comprising the other of the projections, and further comprising first wiring connected to the first half and second wiring connected to the second half, the first and second wirings being configured to be operated independently of one another for providing a pulse train to impart rupture of the fuse-link.

* * * * *